(12) United States Patent
Hou et al.

(10) Patent No.: US 12,262,479 B2
(45) Date of Patent: Mar. 25, 2025

(54) EXTENSION STRUCTURE OF FLEXIBLE SUBSTRATES WITH CONDUCTIVE WIRES THEREON

(71) Applicant: UNEO INC., Taipei (TW)

(72) Inventors: Chih-Sheng Hou, Taipei (TW); Chia-Hung Chou, Taipei (TW); Hsin-Lin Yu, Taipei (TW); Si-Wei Chen, Taipei (TW); Chueh Chiang, Taipei (TW)

(73) Assignee: UNEO INC., Taipei (TW)

( * ) Notice: Subject to any disclaimer, the term of this patent is extended or adjusted under 35 U.S.C. 154(b) by 193 days.

(21) Appl. No.: 18/185,041

(22) Filed: Mar. 16, 2023

(65) Prior Publication Data

US 2024/0314938 A1   Sep. 19, 2024

(51) Int. Cl.
*H05K 3/32* (2006.01)
*H05K 1/03* (2006.01)

(52) U.S. Cl.
CPC ............... *H05K 3/32* (2013.01); *H05K 1/038* (2013.01); *H05K 2201/0145* (2013.01); *H05K 2201/029* (2013.01); *H05K 2201/10287* (2013.01)

(58) Field of Classification Search
CPC .. H05K 3/32; H05K 1/038; H05K 2201/0145; H05K 2201/029; H05K 2201/10287
USPC ......................................................... 361/760
See application file for complete search history.

(56) References Cited

U.S. PATENT DOCUMENTS

| | | | |
|---|---|---|---|
| 9,860,982 B1 | 1/2018 | Main et al. | |
| 2013/0324041 A1* | 12/2013 | Pagani | H01Q 1/2225 455/41.1 |
| 2016/0315044 A1* | 10/2016 | Cheng | H05K 1/028 |

* cited by examiner

*Primary Examiner* — Andargie M Aychillhum
(74) *Attorney, Agent, or Firm* — HAUPTMAN HAM, LLP

(57) ABSTRACT

The present invention relates to an extension structure of flexible substrates with conductive wires thereon. In a first embodiment, three flexible substrates are prepared, each having multiple conductive wires configured on their front surfaces. The third flexible substrate is flipped over, with its conductive wires facing downwards, and bonded across a boundary formed by the first and second flexible substrates. As a result, the corresponding conductive wires between the first and second flexible substrates are electrically coupled with each other through being physically pressed by corresponding conductive wires in the third flexible substrate.

18 Claims, 5 Drawing Sheets

EXTENSION STRUCTURE OF FLEXIBLE SUBSTRATES WITH CONDUCTIVE WIRES THEREON

BACKGROUND

Technical Field

The present invention relates to a conductive wire extension structure for a flexible substrate, particularly related to an extension structure of flexible substrates with conductive wires thereon.

Description of Related Art

These sensors can be used to monitor the vital signs of a patient, for example, by making temperature-sensitive mattresses for monitoring the temperature distribution of the body when a paralyzed patient is lying down. The system can give signals to the caregiver for helping to turn over the patient's body when the body temperature is higher than a predetermined temperature.

FIG. 1 Shows a Prior Art

FIG. 1 shows a prior art—U.S. Pat. No. 9,860,982, which disclosed an electrical connection of electrical wires to flexible conductive elements. It shows an electrical wire 102 positioned onto a conductive substrate 101, an insulating layer 104 configured on the conductive fabric element 106. A thermoplastic elastomer (TPE) layer 108 is configured over the electrical wire 102. Because both the conductive fabric element 106 and the electrical wire 102 are conductive, an electrical connection 111 is formed.

The above conventional electrical connection structure for a fabric must be handled independently for each circuit connection, i.e., using an independent electrical wire 102 to connect each circuit one by one. This process is time-consuming and troublesome. Therefore, faster and more effective connection structures for fabrics are urgently needed to be developed in the flexible conductive industry.

SUMMARY OF THE INVENTION

This invention relates to an extension structure of flexible substrates having conductive wires formed on their surfaces.

In a first embodiment, three flexible substrates are prepared, each having multiple conductive wires configured on their front surfaces. The third flexible substrate is flipped over, with its conductive wires facing downwards, and bonded across a boundary formed by the first and second flexible substrates. As a result, the corresponding conductive wires between the first and second flexible substrates are electrically coupled with each other through being physically pressed by corresponding conductive wires in the third flexible substrate.

A second embodiment includes a first flexible substrate and a second flexible substrate. Multiple conductive wires are formed on the front surfaces of the two flexible substrates. The second flexible substrate is flipped, with the second plurality of conductive wires facing down, and bonded to a rear end of the first flexible substrate, so that the corresponding conductive wires between the first flexible substrate and the second flexible substrate are electrically coupled.

DETAILED DESCRIPTION OF THE INVENTION

Figure 1:
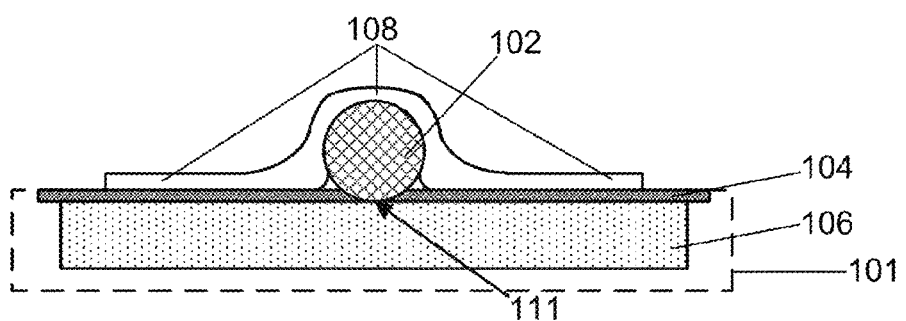
FIG. 1 shows a prior art.
Figure 2:
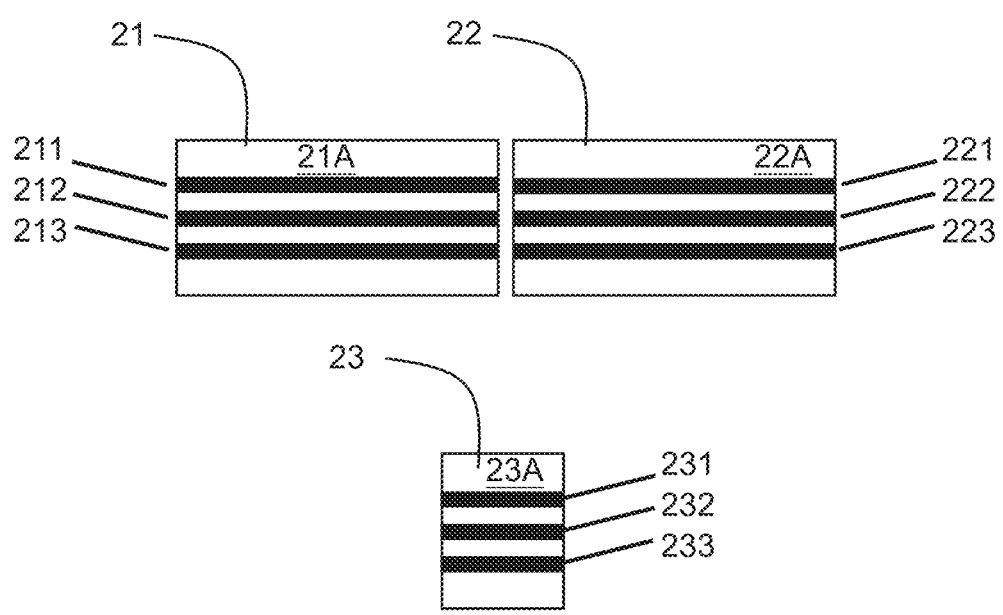
FIG. 2 shows materials for a first embodiment according to the present invention.

FIG. 2 Shows Materials for a First Embodiment According to the Present Invention FIG. 2 shows a first flexible substrate 21, a second flexible substrate 22, and a third flexible substrate 23. The third flexible substrate 23 is a connection unit.

The first flexible substrate 21 has a front surface 21A and rear surface 21B. A first plurality of conductive wires 21X (211, 212, 213) are configured on the front surface 21A.

The second flexible substrate 22 has a front surface 22A and a rear surface 22B. A second plurality of conductive wires 22X (221, 222, 223) are configured on the front surface 22A.

The third flexible substrate 23 has a front surface 23A and a rear surface 23B. The third plurality of conductive wires 23X (231, 232, 233) are configured on the front surface 23A.

Figure 3A:
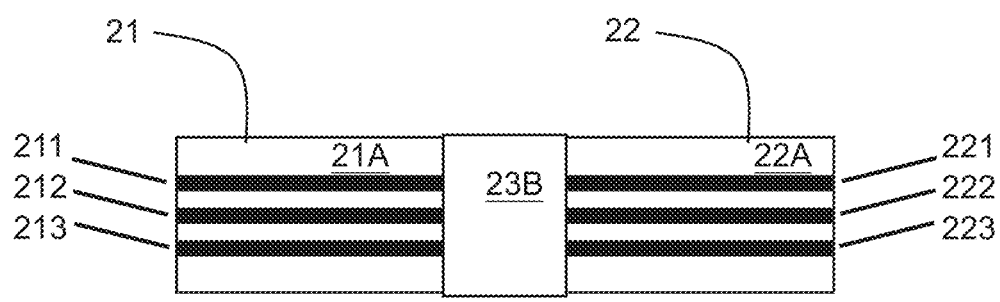
FIG. 3A shows a first embodiment according to the present invention.

FIG. 3A Shows a First Embodiment According to the Present Invention

FIG. 3A shows that the first flexible substrate 21 and the second flexible substrate 22 are coplanarly configured. A rear end of each first plurality of conductive wires 21X is aligned with a front end of a corresponding conductive wire in the second plurality of conductive wires 22X.

The third flexible substrate 23 is flipped, with the third plurality of conductive wires facing down, and bonded across a boundary formed by the first flexible substrate 21 and the second flexible substrate 22, so that each conductive wire in the first plurality of conductive wires 21X is electrically coupled with a corresponding conductive wire in the second plurality of conductive wires 22X through a corresponding conductive wire in the third plurality of conductive wires 23X.

Figure 3B:
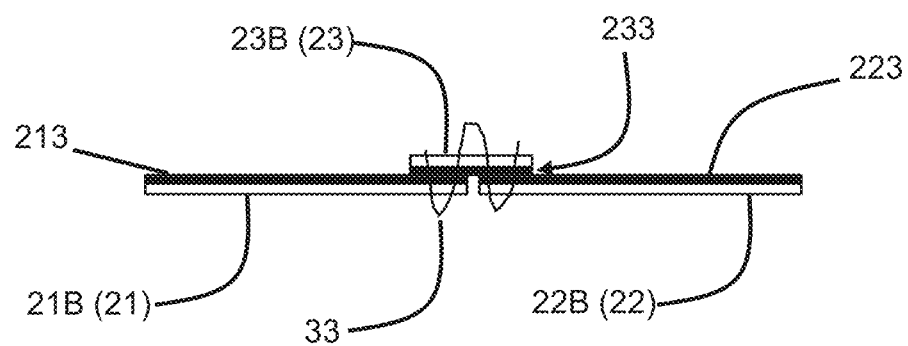
FIG. 3B shows a section view of FIG. 3A

FIG. 3B Shows a Section View of FIG. 3A

FIG. 3B shows that the first flexible substrate 21 and the second flexible substrate 22 are coplanarly configured, and the rear end of the conductive wire 213 in the first plurality of conductive wires 21X is aligned with the front end of a corresponding conductive wire 223 in the second plurality of conductive wires 22X. The third flexible substrate 23 is flipped, with the third plurality of conductive wires facing down, i.e., the front surface 23A of the third flexible substrate 23 faces downward and is bonded across a boundary between the first flexible substrate 21 and the second flexible substrate 22, so that the front end of the conductive wire 233 in the third plurality of conductive wires 23X is bonded to the corresponding conductive wire 213 in the first plurality of conductive wires 21X; also the rear end of the conductive wire 233 in the third plurality of conductive wires 23X is bonded to a corresponding conductive wire 223 in the second plurality of conductive wires 22X; so that the conductive wire 213 is electrically coupled to the conductive wire 223 via the conductive wire 233.

A sewing thread 33 is used to sew at an overlap area formed by the third flexible substrate 23, the first flexible substrate 21, and the second flexible substrate 22. Each conductive wire in the third plurality of conductive wires 23X is physically pressed and electrically coupled with a corresponding conductive wire in the first plurality of conductive wires 21X, and is physically pressed and electrically coupled with a corresponding conductive wire in the second plurality of conductive wires 22X.

Figure 5A:
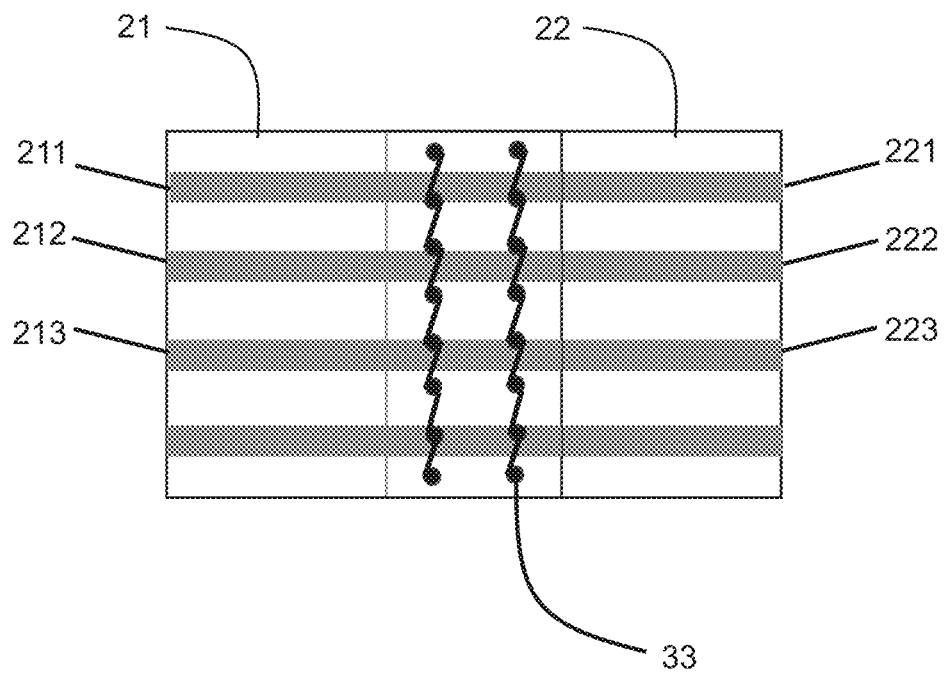
FIG. 5A shows a sewn normal according to the present invention.

The sewing thread 33 can be sewn normal to the conductive wires 21X, 22X, 23X (FIG. 5A). In the present invention, the "sewn normal" refers to a direction of the sewing thread which goes perpendicular to the direction of the conductive wires 21X, 22X and 23X.

Figure 5B:
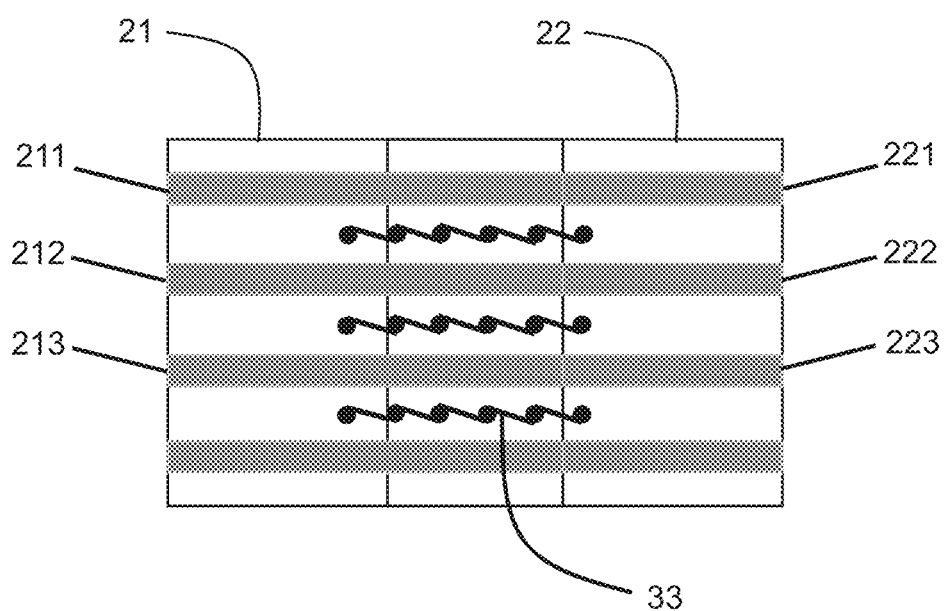
FIG. 5B shows a "sewn parallel" according to the present invention.

The sewing thread 33 can be sewn parallel with the conductive wires 21X, 22X and 23X (FIG. 5B); In the present invention, the "sewn parallel" refers to a direction of the sewing thread which goes and runs along the non-conductive area between the conductive wires in parallel with the conductive wires 21X, 22X, and 23X.

The flexible substrate described in the present invention can be a fabric; the conductive wires can be conductive fibers woven in the fabric. The conductive wires can also be conductive material printed on the surface of the fabric.

The flexible substrate can be polyethylene terephthalate (PET), and the conductive wire is conductive material printed on a surface of the polyethylene terephthalate (PET) substrate.

Figure 4A:
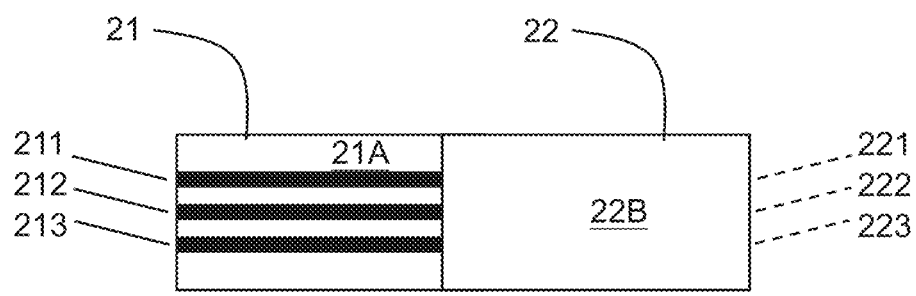
FIG. 4A shows a second embodiment according to the present invention.

FIG. 4A Shows a Second Embodiment According to the Present Invention

FIG. 4A shows an extension structure of two flexible substrates. A first flexible substrate 21 and a second flexible substrate 22 are prepared.

The first flexible substrate 21 has a front surface 21A and a rear surface 21B; a first plurality of conductive wires 21X (211, 212, 213) are configured on the front surface 21A of the first flexible substrate 21.

The second flexible substrate 22 has front surface 22A and a rear surface 22B; a second plurality of conductive wires 22X (221, 222, 223) are configured on the front surface 22A of the second flexible substrate 22.

The second flexible substrate 22 is flipped, with the second plurality of conductive wires 22X facing down, and bonded to a rear end of the first flexible substrate 21 so that each conductive wire in the first plurality of conductive wires 21X (211, 212, 213) is electrically coupled with a corresponding conductive wire in the second plurality of conductive wires 22X (221, 222, 223).

A sewing thread 33 is used to sew the two flexible substrates together. The sewing thread can be sewn normal to the conductive wires 21X, 22X. The "sewn normal" refers to a direction of the sewing thread which goes perpendicular to a direction of the conductive wires.

The sewing thread 33 can also be sewn parallel to the conductive wires 21X, 22X. The "sewn parallel" refers to a direction of the sewing thread which goes in a non-conductive area between adjacent conductive wires 21X, 22X, and follows a same direction as the conductive wires 21X, 22X.

The flexible substrate of the present invention can be a fabric, and the conductive wire can be conductive fibers woven in the fabric. The conductive wire can also be conductive material printed on the surface of the fabric.

The flexible substrate can be polyethylene terephthalate (PET), and the conductive wire is conductive material printed on the surface of the PET.

Figure 4B:
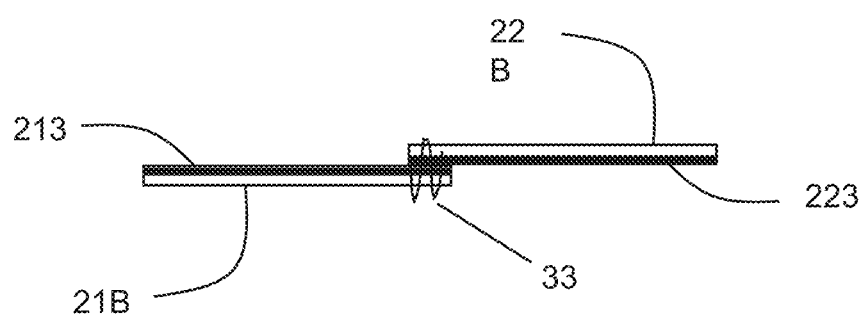
FIG. 4B shows a section view of FIG. 4A

FIG. 4B Shows a Section View of FIG. 4A

FIG. 4B shows a rear end of conductive wire 213 of the first flexible substrate 21 is bonded to a front end of conductive wire 223 of the second flexible substrate 22. A sewing thread 33 is used to sew at an overlap area formed by the first flexible substrate 21 and the second flexible substrate 22, so that the conductive wire 213 is physically pressed and electrically coupled with the conductive wire 223.

FIG. 5A Shows a Sewn Normal According to the Present Invention

FIG. 5A shows a sewing thread 33 which is sewn normal to the conductive wires 21X (211, 212, 213) and 22X (221, 222, 223); the "sewn normal" refers to a direction of the sewing thread which goes perpendicular to a direction of the conductive wires 21X, 22X.

FIG. 5B Shows a "Sewn Parallel" According to the Present Invention

FIG. 5B shows sewing thread 33 which is sewn parallel to the conductive wires 21X (211, 212, 213) and 22X (221, 222, 223). The "sewn parallel" refers to a direction of the sewing thread which goes in a non-conductive area between the conductive wires and runs parallel to the conductive wires 21X, 22X.

The sewing thread used in the present invention is made of non-conductive material to firmly bond two flexible substrates together, and causes the corresponding conductive wires in the first and second substrates electrically coupled with each other.

While several embodiments have been described by way of example, it will be apparent to those skilled in the art that various modifications can be made without departing from the spirit of the appended claims.

What is claimed is:

1. An extension structure of flexible substrates with conductive wires thereon, comprising:
   a first flexible substrate;
   a first plurality of conductive wires configured on a front surface of the first flexible substrate;
   a second flexible substrate;
   a second plurality of conductive wires configured on a front surface of the second flexible substrate;
   a third flexible substrate, which is a connection unit;
   a third plurality of conductive wires configured on a front surface of the third flexible substrate; and
   a sewing thread, sewing at an overlap area formed by the third flexible substrate, the first flexible substrate, and the second flexible substrate, wherein,
   the first flexible substrate and the second flexible substrate are coplanarly configured, and a rear end of each conductive wire in the first plurality of conductive wires is aligned with a front end of a corresponding conductive wire in the second plurality of conductive wires; and
   the third flexible substrate is flipped, with the third plurality of conductive wires facing down, and bonded across a boundary formed by the first and second flexible substrates, so that each conductive wire in the first plurality of conductive wires electrically coupled with a corresponding conductive wire in the second plurality of conductive wires.

2. The extension structure as claimed in claim 1, wherein, the sewing thread is sewn normal to the conductive wires.

3. The extension structure as claimed in claim 2, wherein the "sewn normal" refers to a direction of the sewing thread which goes perpendicular to a direction of the conductive wires.

4. The extension structure as claimed in claim 1, wherein, the sewing thread is sewn parallel to the conductive wires.

5. The extension structure as claimed in claim 4, wherein the "sewn parallel" refers to a direction of the sewing thread which goes in a non-conductive area between adjacent conductive wires, and follows a same direction as the conductive wires.

6. The extension structure as claimed in claim 1, wherein the substrate is a fabric, and the conductive wires are conductive fibers woven in the fabric.

7. The extension structure as claimed in claim 1, wherein the substrate is a fabric, and the conductive wires are conductive materials printed on the surface of the fabric.

8. The extension structure as claimed in claim 1, wherein the substrate is polyethylene terephthalate (PET) and the conductive wires are conductive materials printed on the surface of the PET.

9. The extension structure as claimed in claim 1, wherein each conductive wire in the first plurality of conductive wires electrically coupled with the corresponding conductive wire in the second plurality of conductive wires through physically pressed by the corresponding conductive wires in the third flexible substrate.

10. An extension structure of flexible substrates with conductive wires thereon, comprising:
    a first flexible substrate;
    a first plurality of conductive wires configured on a front surface of the first flexible substrate;
    a second flexible substrate;
    a second plurality of conductive wires configured on a front surface of the second flexible substrate; and
    a sewing thread, sewing at an overlap area formed by the first flexible substrate and the second flexible substrate, wherein
    the second flexible substrate is flipped, with the second plurality of conductive wires facing down, and bonded to a rear end of the first flexible substrate so that the corresponding conductive wires between the first flexible substrate and the second flexible substrate are electrically coupled.

11. The extension structure as claimed in claim 10, wherein, the sewing thread is sewn normal to the conductive wires.

12. The extension structure as claimed in claim 11, wherein the "sewn normal" refers to a direction of the sewing thread which goes perpendicular to a direction of the conductive wires.

13. The extension structure as claimed in claim 10, wherein the sewing thread is sewn parallel to the conductive wires.

14. The extension structure as claimed in claim 13, wherein the "sewn parallel" refers to a direction of the sewing thread which goes in a non-conductive area between adjacent conductive wires and follows the same direction as the conductive wires.

15. The extension structure as claimed in claim 10, wherein the substrate is a fabric, and the conductive wires are conductive fibers woven in the fabric.

16. The extension structure as claimed in claim 10, wherein the substrate is a fabric, and the conductive wires are conductive materials printed on a surface of the fabric.

17. The extension structure as claimed in claim 10, wherein the substrate is polyethylene terephthalate (PET) and the conductive wires are conductive materials printed on the surface of the PET.

18. The extension structure as claimed in claim 10, wherein the sewing thread is made of non-conductive material.

* * * * *